United States Patent [19]

Swartz

[11] Patent Number: 4,764,682

[45] Date of Patent: Aug. 16, 1988

[54] PHOTOSENSITIVE PIXEL SIZED AND SHAPED TO OPTIMIZE PACKING DENSITY AND ELIMINATE OPTICAL CROSS-TALK

[75] Inventor: Louis D. Swartz, Holly, Mich.

[73] Assignee: Ovonic Imaging Systems, Inc., Troy, Mich.

[21] Appl. No.: 917,094

[22] Filed: Sep. 16, 1986

[51] Int. Cl.[4] ............ H01L 27/14; H04N 1/028
[52] U.S. Cl. .................. 250/578; 250/211 J; 357/30; 358/213.11; 358/213.15
[58] Field of Search ............ 250/578, 211 R, 211 J; 357/30 D, 30 H, 30 K, 31, 32; 358/212, 213.11, 213.15, 213.16, 213.18, 213.28

[56] References Cited

U.S. PATENT DOCUMENTS 4,499,384  2/1985  Segawa et al. ............ 358/213.11
4,551,623  11/1985  Elliott et al. ............ 250/578
4,565,928  1/1986  Yamamoto et al. ............ 250/578

FOREIGN PATENT DOCUMENTS

0038061  3/1982  Japan ............ 358/213.16
0147158  8/1985  Japan ............ 357/32

Primary Examiner—Edward P. Westin
Attorney, Agent, or Firm—Marvin S. Siskind; Richard M. Goldman

[57] ABSTRACT

A photosensitive pixel adapted for use in an image sensing array includes a photogenerative element and a blocking element. The shapes and sizes of the elements are chosen so as to cooperate in defining an overall pixel configuration having a geometry which maximizes the packing density capabilities thereof and insures that both elements sense only incident radiation emanating from a corresponding portion of an image.

26 Claims, 4 Drawing Sheets

PHOTOSENSITIVE PIXEL SIZED AND SHAPED TO OPTIMIZE PACKING DENSITY AND ELIMINATE OPTICAL CROSS-TALK

FIELD OF THE INVENTION

This invention relates to photosensitive pixels and, more particularly, to pixels adapted for use in an array of photosensors. The invention relates most particularly to a pixel having a geometric configuration adapted to optimize the packing density thereof, and to substantially eliminate optical cross-talk so as to provide for the manufacture of high sensitivity, high density photosensitive arrays which have the capability of sensing high resolution images.

BACKGROUND OF THE INVENTION

Image or optical scanners are enjoying ever-growing utility in a variety of products and for a diversity of applications. For the purpose of understanding the subject invention, "image or optical scanners" are defined as including one or more photoresponsive circuits or elements operatively disposed so as to optically scan a pattern of data and generate a detectable signal representative of the scanned pattern.

Optical scanners may be readily adapted to address a wide variety of data inputs. The data may be in the form of a photograph, a drawing, a design on fabric or the like or any other such graphic patterns. In other forms, the data being scanned may be alpha-numeric data such as printed or written matter. Regardless of the form of data, the image scanners are adapted to convert a pattern of data into an electrical signal which may be supplied to downstream apparatus for further processing, storage or display. For example, image scanners have been incorporated into facsimile machines, copying machines, computer input terminals, CAD-CAM systems and the like. Additionally, image scanners are utilized in production processes to inspect the surfaces of materials such as plywood, fabric, and metal. The typical image scanner includes one or more photosensitive pixels disposed so as to either simultaneously, or sequentially address various portions of the surface being scanned.

There are several approaches currently employed for the fabrication of image scanners. Charge coupled devices (CCD's) form the basis for one such approach. CCD's are solid state devices, typically formed from crystalline silicon and including therein a plurality of photoresponsive circuits each having a pixel associated therewith. CCD's have a high degree of photosensitivity and are capable of providing high resolution. However, CCD's are relatively small in size; the typical CCD array is approximately one inch in length, and the largest CCD's currently produced are approximatey 3 to 4 inches in length. These size constraints impose restrictions on the utility of CCD's in scanners. In those instances where a pattern of information having dimensions larger than that of the CCD is being scanned, an optical system must be utilized to project that pattern of information at a reduced size onto the surface of the CCD. Aside from being expensive and bulky, such optical systems will effectively reduce the resolution of the CCD.

Thin film devices represent another approach to the fabrication of image scanners. Thin film devices may be formed by vapor deposition of layers of appropriate semiconductor materials onto a variety of substrates. By appropriately patterning these layers, a variety of device configurations may be fabricated.

Recently, considerable progress has been made in developing processes for depositing thin film semiconductor materials. Such materials can be deposited to cover relatively large areas and can be doped to form p-type and n-type semiconductor materials for the production of semiconductor devices such as p-i-n type photodiodes equivalent, and in some cases superior to those produced by their crystalline counterparts. One particularly promising group of thin film materials are the amorphous materials. As used herein, the term "amorphous" includes all materials or alloys which have long range disorder although they may have short or intermediate range order, or even contain at times crystalline inclusions. Also as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occur.

It is now possible to prepare by glow discharge, or other vapor deposition processes, thin film amorphous silicon, germanium or silicon-germanium alloys in large areas, said alloys possessing low concentrations of localized states in the energy gap thereof and high quality electronic properties. Techniques for the preparation of such alloys are fully described in U.S. Pat. Nos. 4,226,898 and 4,217,374 of Stanford R. Ovshinsky, et al., both of which are entitled "Amorphous Semiconductor Equivalent to Crystalline Semiconductors" and in U.S. Pat. Nos. 4,504,518 and 4,517,223 of Stanford R. Ovshinsky, et al., both of which are entitled "Method of Making Amorphous Semiconductor Alloys and Devices Using Microwave Energy"; the disclosures of all of the foregoing patents are incorporated herein by reference.

Thin film alloys may be readily manufactured in large areas by mass production processes and therefore enable the economic manufacture of large scale image sensor arrays. Use of such large arrays eliminates the need for complicated optical systems thereby effecting savings in cost, product size and processing steps. Additionally, since the thin film sensor arrays are fabricated to be of approximately the same size as the object being scanned, relatively high resolution may be attained without the necessity of employing high resolution photolithographic processing steps. It may thus be seen that thin film photosensor arrays have significant utility in the fabrication of image scanners.

Typical thin film image scanners include an array of photoresponsive circuits, each of which incorporate therein a photogenerative element adapted to provide an electrical signal corresponding to the quantity of light incident thereupon. It would be very time consuming to utilize a single element for scanning, accordingly, an array of elements in either linear or two dimensional form is typically utilized. In those instances where such an array is employed, each photosensitive circuit of the array must also include a blocking element such as a diode or transistor. The blocking element facilitates addressing of the various photogenerative elements in the matrix by preventing current flows through unwanted paths in the matrix. In this manner, the blocking device eliminates cross talk which would otherwise degrade the signal produced by the photosensitive element.

Problems can occur in the use of photosensitive arrays because of the generation of charge carrier pairs within the blocking element thereof due to the absorption of incident illumination. Light having an energy greater than the band gap of the semiconductor material from which the blocking element is fabricated is capable of generating an electron-hole pair in that material. If a field is present across the semiconductor material, the electron-hole pair is separated, thereby generating a flow of electrical current. Such illumination can produce a flow of electrical current which will effectively be a source of "noise" which dissipates or otherwise degrades the signal produced by and hence the sensitivity of the photosensitive elements. This problem has heretofore been dealt with in several manners. According to one approach, the blocking element has been masked with an opaque material so as to prevent ambient light from striking it. While this approach does solve the problem, it necessitates additional processing steps and wastes valuable real estate which could otherwise be utilized to improve resolution in a two dimensional matrix.

Because of the shortcomings of the masking approach, a new pixel configuration and driving scheme has been developed which eliminates the need for covered blocking elements, the details of which are disclosed in U.S. Pat. Application Ser. No. 907,926 filed Sept. 16, 1986, now U.S. Pat. No. 4,714,836 issued Dec. 22, 1987 and entitled "Photosensitive Pixel With Exposed Blocking Element", the disclosure of which is incorporated herein by reference. As detailed in the foregoing application, the blocking element of a pixel need not be shielded from incident radiation, since photocurrents generated therein will not discharge or otherwise dissipate the signal produced by the photogenerative element. It has, in fact, been found by the instant inventor that when using the pixel and driving scheme of the aforementioned application, photocurrents produced by the blocking element will actually contribute to those produced by the photogenerative element.

However, the photocurrent provided by the blocking element can, in some instances, be a source of unwanted signal degradation, even though it does not actually discharge the signal from the photogenerative element. This is because of the phenomenon known as "optical cross-talk." Optical cross-talk occurs when the blocking element and the photogenerative element of a pixel are illuminated by radiation emanating from different portions of the image being sensed. If the photogenerative element is illuminated by radiation from a dark image portion, while the blocking element is illuminated by radiation from a light image portion, the signal generated by the blocking element will attenuate the signal generated by the photogenerative element thereby reducing signal sensitivity.

Optical cross-talk can thus be seen to be a problem which can degrade the sensitivity of a photosensitive pixel. Obviously, the problem can be eliminated by masking the blocking element; however, such a solution is not preferred for the reasons discussed previously. Therefore, it will be appreciated that there is a need for a photosensitive pixel having an unmasked blocking element, which pixel is not susceptible to problems of optical cross-talk.

Furthermore, it is also desirable to maximize the geometrical packing density of pixels in an array so as to maximize the resolution of that array. The present invention provides for an improved photosensitive pixel including a blocking element and a photogenerative element in which the respective sizes and shapes of the elements cooperate so as to substantially eliminate optical cross-talk and to maximize the geometric packing density of the pixels when disposed in a photosensitive array.

These and other advantages of the instant invention will be apparent from the brief summary of the invention. The drawings and detailed description thereof and the claims which follow.

BRIEF DESCRIPTION OF THE INVENTION

There is disclosed herein a photosensitive pixel for use in an array. The pixel includes a photogenerative element and a current blocking element, said elements being electrically interconnected and adapted to provide a detectable signal corresponding to the quantity of radiation emanating from a portion of an image and incident thereupon. In accordance with the principles of the instant invention, the photogenerative element has a first size and shape and the blocking element has a second size and shape. The first and second sizes and shapes cooperate to define an overall pixel configuration which geometrically maximizes the packing density of the pixels in an array. The photogenerative element and the blocking element are further disposed in close proximity relative to one another so as to only sense incident radiation emanating from said corresponding image portion. The photogenerative element is adapted to absorb incident radiation and provide an electrical signal in response thereto; the blocking element may also be photogenerative with the capability of providing an electrical signal in response to the absorption of radiation and thereby positively contribute to the detectable signal produced by the pixel.

The photogenerative element and the blocking element may be disposed either in a generally coplanar relationship or in a stacked relationship. In one instance, the shape of the photogenerative element and the blocking element cooperate to define a pixel having a rectangular configuration whereas in other instances they define a pixel with a polygonal configuration and in still other instances define a pixel having a periphery which is at least partially curvilinear.

Either or both of the photogenerative and the blocking elements may have a shape which is generally rectangular, triangular, L-shaped or otherwise regularly or irregularly shaped. In one preferred embodiment, the ratio of the surface area of the photogenerative element to that of the blocking element is at least five to one whereas in preferred embodiment the ratio is at least ten to one.

The photogenerative element may be formed as any one of a wide variety of electronic devices such as, for example, a phototransistor, a photoresistor, a photodiode, including a Schottky barrier diode and the like. In those instances where the photogenerative element is a photodiode, it may include oppositely doped layers of thin film semiconductor material, and in still other instances may include a layer of substantially intrinsic semiconductor material interposed between the oppositely doped layers so as to form a p-i-n type photodiode. The p-i-n type photodiode may be formed from a material chosen from the group consisting essentially of amorphous silicon alloy materials, amorphous germanium alloy materials, and amorphous silicon germanium alloy materials. In still other instances, the photogenerative element may include a plurality of p-i-n type photodiodes stacked in optical and electrical series relationship.

The blocking element may similarly be formed as any one of a wide variety of electronic devices such as transistors, resistors and diodes, including Schottky barrier diodes. The blocking element may similarly include a pair of oppositely doped layers of thin film semiconductor alloy material and, in some instances may be a p-i-n type diode which may include a layer of semiconductor alloy material chosen from the group consisting essentially of amorphous silicon alloy materials, amorphous germanium alloy materials, and amorphous silicon germanium alloy materials. In still other instances, the blocking diode may comprise a plurality of stacked p-i-n type diodes disposed in optical and electrical series relationship.

DETAILED DESCRIPTION OF THE PREFERRED EMBODIMENTS

Figure 1A:
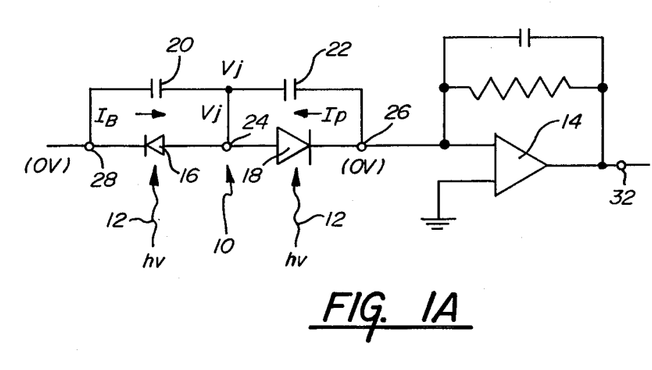
FIGS. 1A through 1B illustrate, in schematic fashion, the preferred method of reading the signal photogenerated by the photosensitive pixel of the instant invention.
Figure 1B:
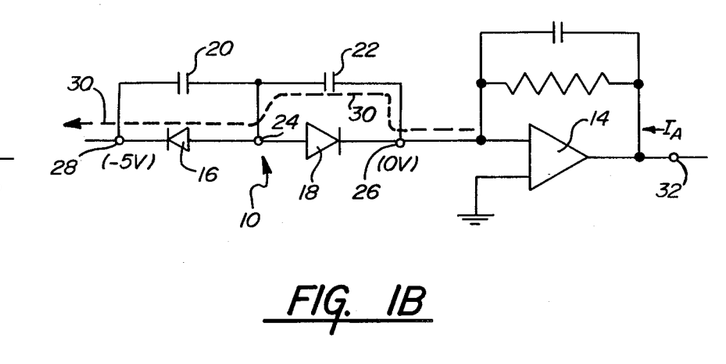

The instant invention will best be understood with reference to the drawings. FIGS. 1A and 1B illustrate a preferred method of, and circuit for, reading the signal generated by an individual photosensitive circuit during the operation of an array of photosensitive pixels. As used herein the terms "photosensitive circuit" or "photoresponsive circuit" shall refer to that portion of a photosensitive array associated with an individual pixel, and typically includes a photogenerative element adapted to provide a detectable signal in response to the absorption of incident illumination, a blocking element adapted to selectively restrict current flow through portions of the circuit and the associated addressing means. FIG. 1A represents a photosensitive pixel 10 adapted to receive incident radiation 12, while FIG. 1B represents the photosensitive pixel 10 being read by output amplifier 14. As may be seen by reference to FIGS. 1A and 1B, photosensitive pixel 10 comprises two diodes, a blocking diode 16 and a photodiode 18 electrically connected in back-to-back series fashion. For convenience in explaining the operation of photosensitive pixel 10, the internal capacitances 20 and 22 of diodes 16 and 18, respectively, are shown in FIG. 1A and 1B separate components. The anodes of diodes 16 and 18 are connected to a common point or node 24. The cathode of the photodiode 18 is connected to an output node 26 while the cathode of blocking diode 16 is connected to an input node 28.

Both diodes 16 and 18 may be, and preferably are, manufactured and operated so that they respectively generate an electric current $I_B$ and $I_P$, when exposed to light during operation. In this regard, each diode may be thought of as a miniature solar cell, the energy output thereof per scanning cycle being proportional to the total amount of radiation incident thereupon during the scanning cycle. It should be noted that since the photosensitive pixel 10 effectively integrates the total charge produced by incident light thereon over each scanning cycle, it is more sensitive than those prior art photosensitive element which measure incident light on a solely instantaneous basis. The signal amplifier 14 is adapted to create a amplified output signal proportional to the current passing through node 26 when the photosensitive pixel 10 is read.

It is an important feature of the instant invention that the voltage at node 26 and at node 28 be maintained at substantially the same value during the sense (i.e. non-read) portion of the cycle. This prevents any photocurrent generated during illumination of the blocking diode 16 from dissipating or otherwise degrading the photocurrent produced by the photodiode 18 and stored at node 24. For this reason, the blocking diode 16 need not be masked from incident light, thereby simplifying pixel design and processing steps. The voltage at node 26 between the photodiode 18 and the amplifier 14 and the voltage at the input node 28 are both preferably maintained at zero volts whenever the photosensitive pixel 10 is not being read, as indicated in FIG. 1A, although other common voltage values may be similarly utilized.

Accordingly, when diodes 16 and 18 are exposed to light, as indicated in FIG. 1A, they respectively generate photocurrents $I_B$ and $I_P$, which currents are directed toward node 24, thereby causing the junction voltage $V_J$ to be less negative than the negative voltage placed on node 24 the last time the photosensitive pixel 10 was read.

As indicated in FIG. 1B, in order to read the integrated charge produced by incident light falling upon photosensitive pixel 10, the voltage at input node 28 is decreased, for example from zero volts to −5 volts. The blocking diode 16 is thus rendered conductive and passes current until the voltage at node 24 is about equal to −5 volts.

In practice, the built-in potential of the diode 16 may prevent the voltage at node 24 from reaching the voltage applied to the input node 28. This change in voltage at node 24 is accompanied by a current flow indicated by dashed line 30. The photodiode 18 is reversed biased at this time, and depending upon the duration of the reading pulse, will experience a final reverse bias voltage of nearly −5 volts. At times, it is useful to consider this reverse current flow 30 as passing through internal capacitance 22 of the photodiode 18, thereby charging capacitor 22 to 5 volts. On the other hand, blocking diode 16 is forward biased, thus allowing its internal capacitance 20 to effectively discharge, that is, the voltage across internal capacitance 20 will be equal to the final forward voltage drop achieved across the diode 16. The current flow 30 which passes through node 26 is amplified by the signal amplifier 14, and produces an amplified current $I_A$ which passes through output node 32 and is proportional to the light intensity received during the current scanning cycle by photosensitive pixel 10. At the end of the scanning pulse, the voltage at input node 28 is returned to zero volts, and the voltage $V_J$ at node 24 remains at nearly −5 volts unless the photosensitive pixel 10 is subjected to further incident radiation. Finally, node 26 is returned to zero volts and the circuit is reset in the sense mode.

Figure 2:
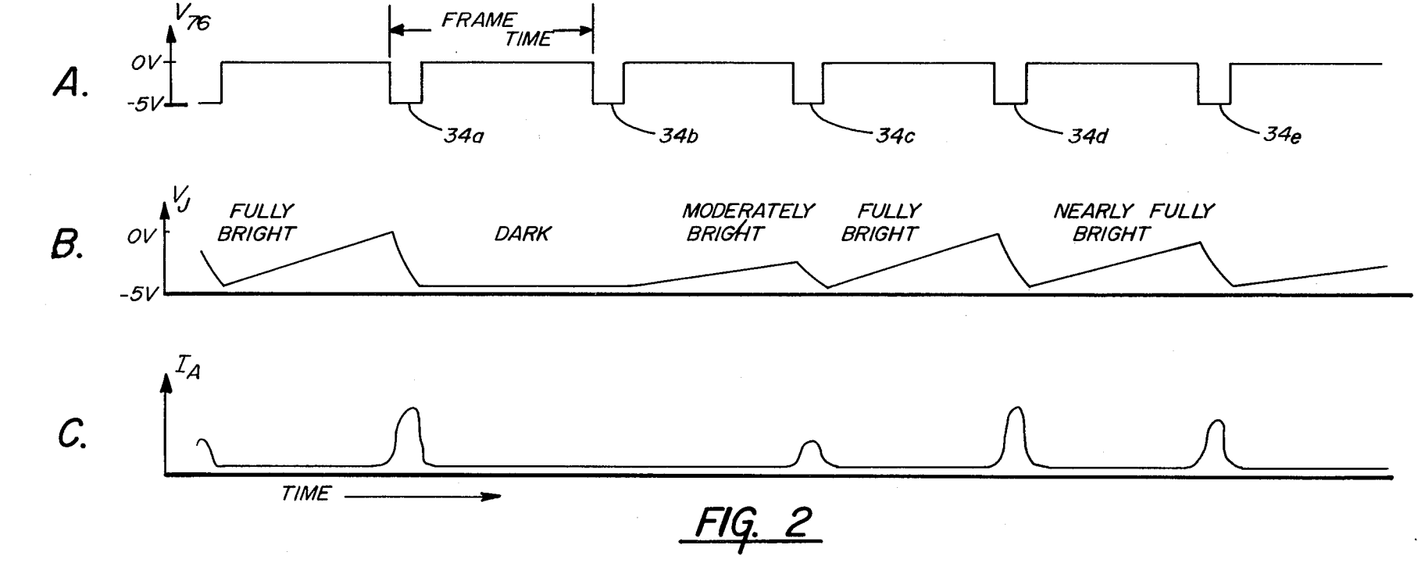
FIG. 2 illustrates a timing diagram relating to the method of reading the signals photogenerated by the photosensitive pixel of the instant invention shown in FIGS. 1A and 1B.

FIGS. 2A through 2C comprise a timing chart of three waveforms collectively illustrating the time response of the output of a photosensitive pixel, such as 10, in response to light of varying intensity. The first waveform in FIG. 2A shows the −5 volt driving pulses placed at input 28 in FIG. 1B. One skilled in the art will appreciate that the duration of time interval and frame time may be varied to accomodate differing time responses and the number of photosensitive pixels to be addressed.

The waveform shown in FIG. 2B shows the corresponding voltage $V_J$ produced at node 24 in the photosensitive pixel 10 of FIG. 1B when it successively encounters consecutive segments of the image to be scanned which have full brightness, full darkness, intermediate brightness, full brightness, and nearly full brightness, respectively. As shown, in encounterning a fully bright segment of the image, the voltage $V_J$ at node 24 increases from nearly −5 volts to nearly zero volts. At the end of this first charging period, the input pulse 34a causes this voltage to return from nearly zero volts to −5 volts. Correspondingly, the output current signal, shown in FIG. 2C, measures the current through the blocking diode 16.

Figure 3:
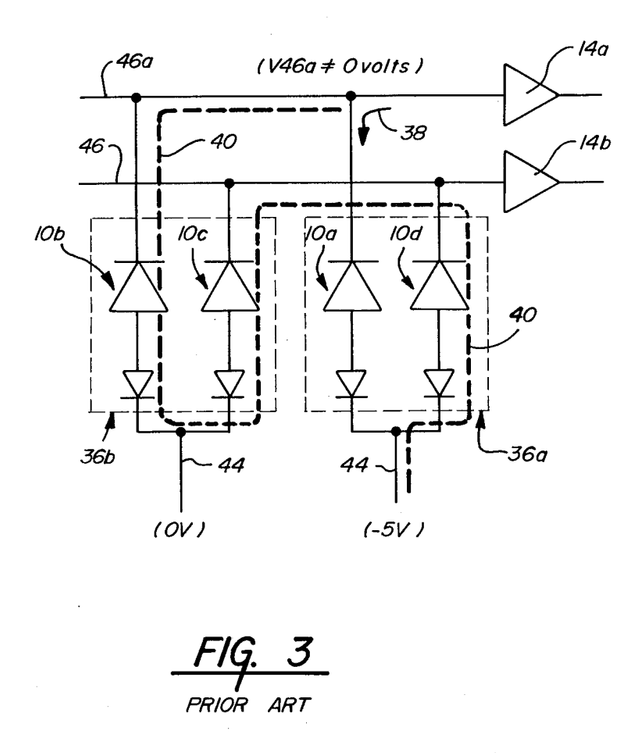
FIG. 3 illustrates, in a schematic form, electrical cross-talk occurring between adjacent groups of photosensitive pixels of the prior art.

In the next scanning cycle or frame where the image encountered is dark, no significant photocurrents are generated, and accordingly, the voltage $V_J$ at junction node 24 does not change at the occurrence of the read-out pulse 34b. Where the image may consist of segments producing brightness levels intermediate to, that is, between dark and fully bright, the photocurrents generated will have values intermediate 0 and −5 volts and an intermediate change in voltage at node 24 is experienced. During the next read-out pulse 34c, only a moderate voltage change is generated at node 24 and a moderate output is produced at node 32 as correspondingly shown in FIG. 3C.

The read-out scheme just described possesses significant advantages over other read-out techniques known in the art. One such advantage is in the virtual elimination of electrical cross-talk due to undesired current leakage through other elements in electrical communication therewith. The reason for this result may be explained by reference to FIG. 3, where for the purposes of clarity and ease of discussion, a prior art linear array, consisting of two photosensitive circuits or groups 36a and 36b having two photosensitive elements each, is shown. Amplifier 14a, when connected as shown, serves to sense the current generated by either photosensitive pixel 10a of group 36a or of photosensitive pixel 10b of group 36b, depending upon which group is being interrogated. In practice, the total current sensed by the amplifier 14a when reading the photosensitive element 10a is the sum of the currents passed through a plurality of current paths including the current 38 from the photosensitive element 10a and the additional leakage current 40 which passes through the pixels 10b and 10c of the unselected group 36b, and through another of the pixels 10d in selected group 36a in a route indicated by heavy dashed line 40. Such currents are created by the variance in operating characteristics among photosensitive pixels 10 and the fact that the output lines 46 are not maintained at zero volts. In a large photosensitive array having dozens or hundreds of groups of pixels this unwanted cross-talk current can adversely affect the accuracy of the readings of the individual photosensitive pixels 10. In the present invention, however, where input lines 44 and output lines 46 are maintained at substantially similar potentials, cross-talk currents generated by and passing through the photosensitive pixels 10 of unaddressed groups of pixels do not exist. Therefore, the current required to recharge each pixel 10 is detected only by its corresponding amplifier 14.

Figure 4:
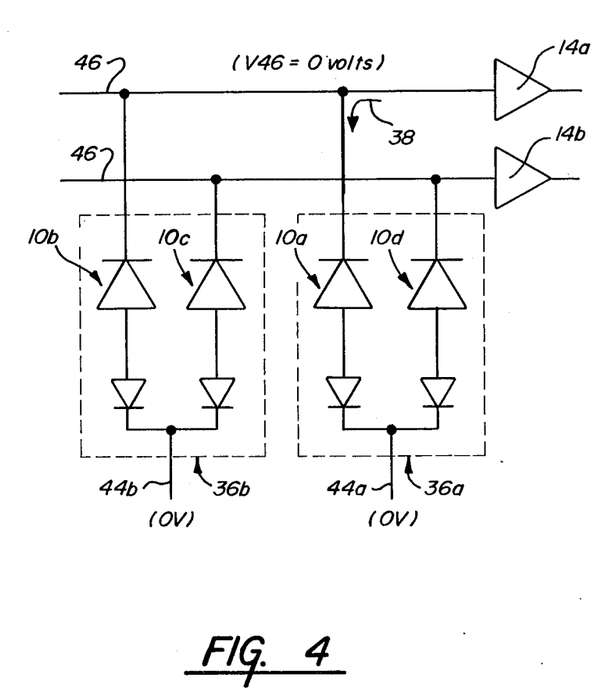
FIG. 4 illustrates, in schematic form, the technique of reading photosensitive pixels without cross-talk.

FIG. 4 is a simplified schematic diagram of the preferred mode of addressing and reading the photosensitive pixels 10 of the present invention. As illustrated, all output lines 46 as well as all input lines 44 are held at zero volts, thereby eliminating undesired leakage currents. Since the individual photosensitive pixels 10 in non-addressed groups are at the same voltage, no current will be passed through these non-addressed pixels. This effectively prevents cross-talk since there are no effective paths, i.e., a path having a voltage drop, through which such cross-talk currents are driven. Those in the art will appreciate that this preferred method of reading an array such as a linear array of photosensitive pixels also eliminates the need to closely match the I–V characteristics of all blocking diodes and of all photodiodes.

Figures 5, 6:
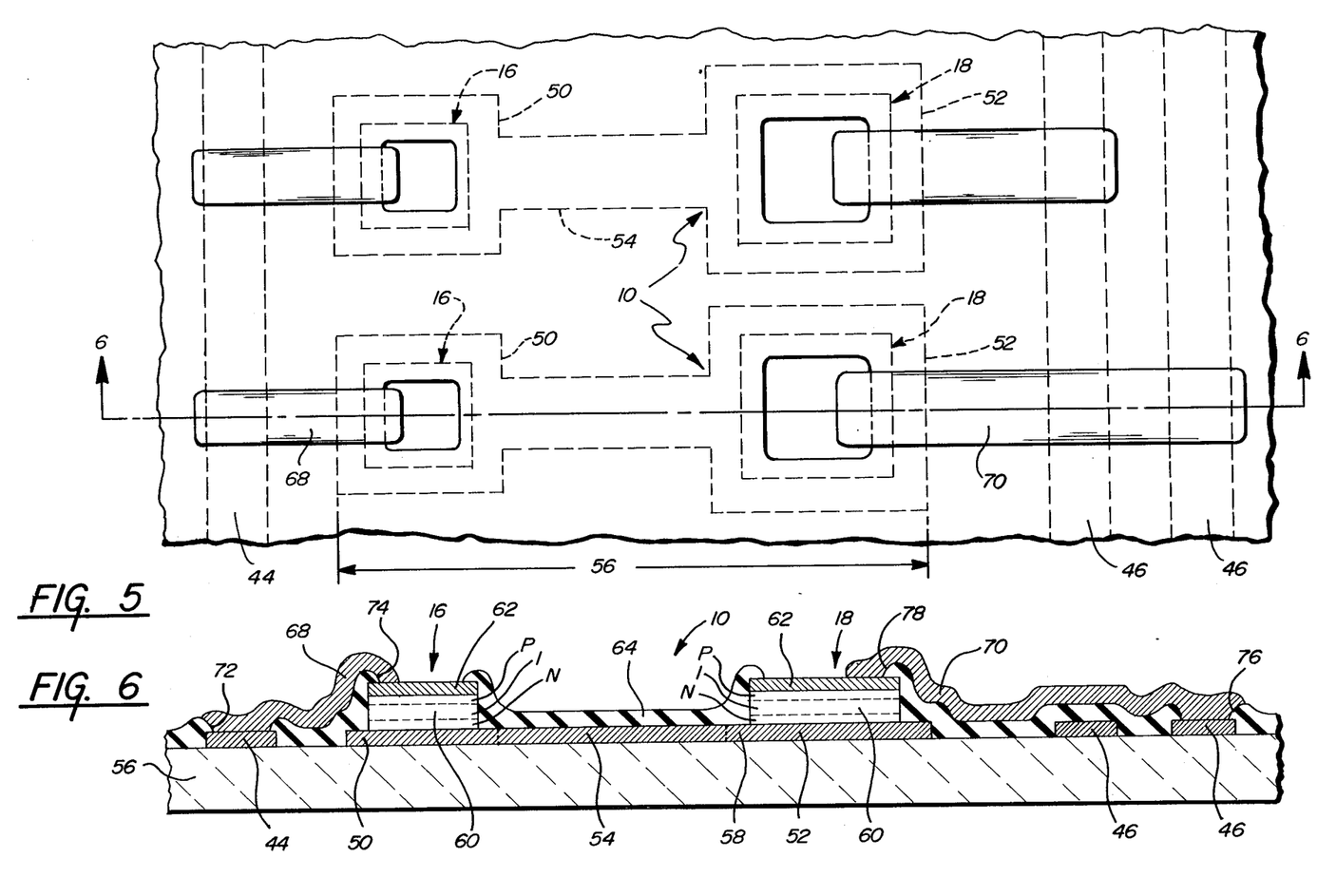
FIG. 5 is a top plan view illustrating electrical connections of the photosensitive pixels into an array as contemplated by the instant invention.
FIG. 6 is a cross-sectional side view of one of the individual photosensitive pixels illustrated in FIG. 5.

FIG. 5 is a top plan view of two adjacent photosensitive pixels 10 and associated output lines 46 and input line 44. FIG. 6 is a corresponding cross-sectional side view of one of the photosensitive pixels 10 taken along line 6—6 of FIG. 5. FIGS. 5 and 6 illustrate that the photosensitive pixels 10, the input line 44 and the output lines 46 can be formed as a single integrated structure using well known techniques for depositing thin film semiconductor alloy material, insulators and conductive lines, and patterning same using conventional photolithographic techniques. As is suggested by FIG. 5, a photosensitive array may comprise a plurality of photosensitive pixels 10 spacedly disposed adjacent and parallel to one another. For an array, the approximate dimensions of the photosensitive pixels 10, which are identical, may be as follows. The center to center spacing between adjacent pixels 10 in any direction may be about 60 microns. The photodiodes 18 may be formed as a square having sides of approximately 42 microns each and the blocking diodes 16 may be formed as a square having sides of approximately 24 microns each. The blocking diode 18 may be located on top of a suitable conductive base 50 about 30 microns square, which base serves as one of its electrodes; while the photodiode 18 may be located upon a suitable conductive base 52 about 52 microns square, which base serves as one of its electrodes. Conductive bases 50 and 52 are preferably interconnected by a conductive connector 54. The overall longitudinal dimension 56 of the photosensitive pixel 10 may be approximately 250 microns. Because the photocurrent generated by each of the photodiodes 18 is proportional to the diode area, an array having greater sensitivity may be created when the photodiode 18 is increased in size. However, as is readily seen from FIG. 5, an increase in the size of each photodiode will affect the resolution of the resulting array. Furthermore, if the blocking diode is made too large relative to the photodiode, excess capacitance may be added to the circuit, which capacitance will be detrimental to the operation thereof. Consequently, it has been found desirable to have the photodiode cover an area which is at least five times and preferably ten times greater than the area of the blocking diode.

FIG. 6 shows that the photosensitive pixel 10 may be formed on an insulating substrate 56, which substrate is preferably Corning 7059 glass, but may be formed from any other suitable material, such as stainless steel coated with an insulating layer. Formed on top of substrate 56 is a bottom metal layer 58, which may be chromium, said layer 58 subsequently photolithographically patterned using conventional techniques to form a patterned metallic layer under each photosensitive pixel 10 and to simultaneously form input line 44 and output lines 46. The patterned metal layer 58 forms the conductive bases 50 and 52, which bases respectively serve as one of the electrodes for the diodes 16 and 18. They metal layer 58 also forms conductive connector 54 interconnecting the two bases. Next, layers of N-I-P semiconductor alloy material 60 are deposited upon bases 50 and 52 so as to form the photogenerative portions of diodes 16 and 18. Placed over each of the layers 60 is a discrete top contact 62, said top contact preferably being made from transparent conductive oxides such as indium tin oxide (ITO). An insulating layer 64 is then deposited and patterned in order to insulate conductive lines or traces 68 and 70 from electrically communicating with other portions of the array, except where desired. For example, conductive line 68 contacts input line 44 through via 72 and is electrically connected to contact 62 of the blocking diode 16 through via 74. Similarly, conductive line 70 contacts output line 46 through via 76 and is electrically connected to the top contact 62 of the photodiode 18 at via 78.

It will be appreciated that conductive connector 54 of bottom conductive layer 58 causes photodiodes 16 and 18 to be electrically connected in back-to-back communication, while the top metal conductive lines 68 and 70, respectively, provide the electrical connection to the electrodes of the diodes 16 and 18 opposite the bottom connecting layer 58.

In prior art structures it was necessary to cover the blocking or isolation diode 16 with a metal or other opaque layer to prevent it from being affected by incident light so as to avoid the generation of current which produced increased noise in the output of the photosensitive circuit, thereby decreasing the sensitivity thereof. In the present invention, however, it is not necessary to mask the blocking diode 70 from incident light.

Figure 7:
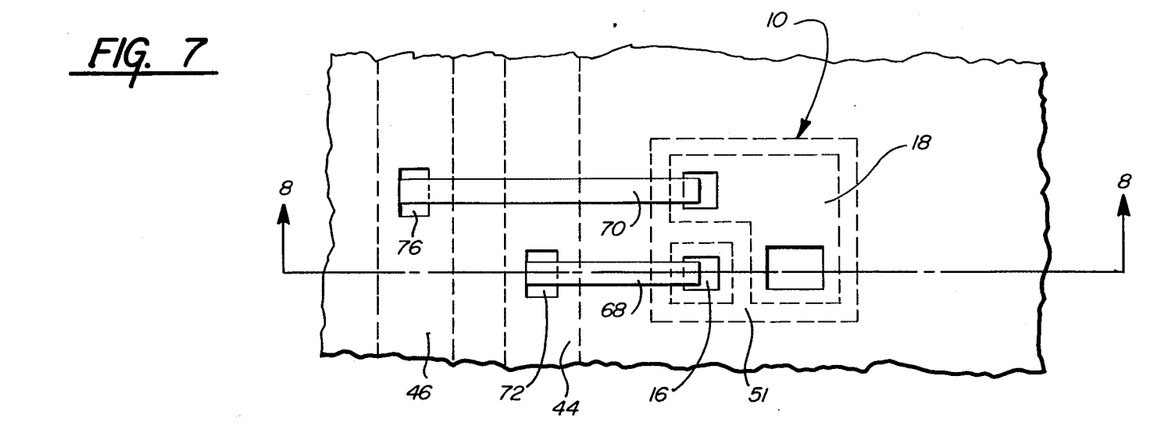
FIG. 7 is an enlarged, fragmentary top plan view of an image scanning system utilizing a plurality of pixels, each of said pixels including a photodiode and a blocking diode sized, shaped and disposed in proximate relationship in accordance with the principles of the instant invention.
Figure 8:
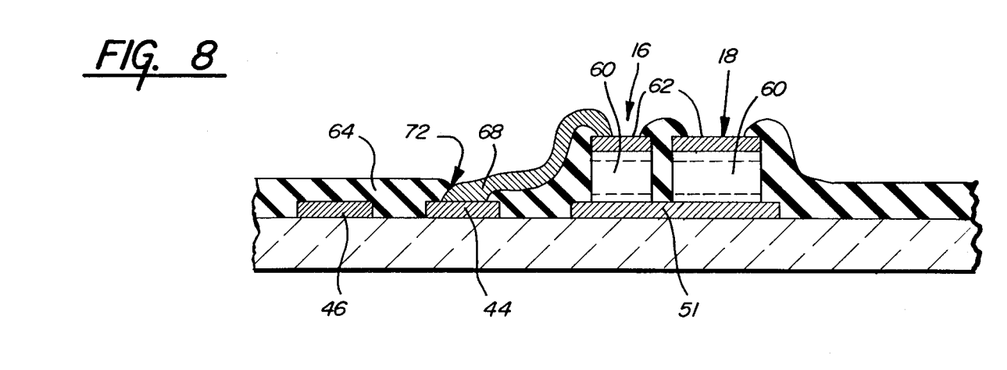
FIG. 8 is a cross sectional view taken along line 8—8 of FIG. 7 illustrating the image scanning system of the instant invention.

The size, shape and proximate disposition of the photodiode 18 relative to the blocking diode 16 of the instant invention is best illustrated in FIGS. 7 and 8. The various conductive connectors 68 and 70 serve to connect the top contact pads 62 of the photodiode 18 and blocking diode 16, respectively, to the appropriate input line 44, output line 46. These electrical connections to the input line 44 and output line 46 are made through vias, such as 72 and 76, respectively, formed in the insulating layer 64.

One of the important advantages of the instant invention as shown in FIGS. 7 and 8 is that the photosensitive pixel 10 has the square shape thereof defined by the cooperating shapes of each of the photodiode 18 and the blocking diode 16. In this manner, the photosensitive pixel 10 has an effective active area approximately equal to the sum of the discrete areas of the blocking diode 16 and the photodiode 18. By so configuring the active area of the photosensitive pixel 10 in a square-like rectangular boundary, an increased packing density of a large area array of pixels may be achieved. This optimized utilization of real estate provides a maximized number of pixels 10 to be constructed within any given unit area, and accordingly, provides for improved resolution of a large area array. Another important advantage of the instant invention is that electrical connections to the photodiode 18 and blocking diode 16 can be established on a single side of the pixel thereby increasing the number of linear sensor arrays which may be constructed on a single large area substrate.

A further important advantage of utilizing the pixel configuration illustrated in FIGS. 7 and 8 is in the elimination of optical cross-talk. Since the photogenerative element 18 and the blocking element 16 are in close proximity, they will each receive incident light emanating from the same portion of an image being sensed. Since the signal produced by the blocking element 16 will correspond to that provided by the photogenerative element 18, the photogenerated blocking elment signal can be used in an additive manner to reinforce the output signal of the photogenerative element 18. It will thus be appreciated that spurious light has been denied entry into the photogenerative region of the photosensitive pixel, thereby eliminating optical cross-talk will increase pixel sensitivity. Further, since only light emanating from the image portion being sensed reaches the photogenerative region of the photosensitive pixel, the pixel sensitivity is increased.

While the photogenerative element and blocking element have been described as cooperating to form a generally square-shaped pixel, the scope of the subject invention is intended to include any cooperation of shapes which provide for a high packing density of pixels when those elements are employed in a large area, linear array or a two-dimensional matrix. Alternatively, complimentary shapes such as rectangles, curvilinear configurations, triangular or other polygonal configurations are specifically within the scope of the instant invention.

As shown by the preceeding discussion, the instant invention provides a novel addressing scheme allowing for the fabrication of photosensitive arrays which do not require light shielding of the blocking elements thereof and which exhibit reduced electrical cross-talk between the pixels thereof.

While preferred embodiments of the present invention has been disclosed in detail, it is to be appreciated that those skilled in the art may make various modifications and changes without departing from the spirit of the instant invention. For example, elements other than diodes may be substituted for the blocking and photogenerating elements; the principles hereof being equally applicable to circuits including thin film transistors, crystalline transistors and the like. It is the following claims, including all equivalents which are meant to define the scope of the instant invention.

We claim:

1. A photosensitive pixel adapted for use in an array, said pixel including a photogenerative element and a current blocking element, said elements being electrically interconnected for providing a detectable signal corresponding to the quantity of radiation incident thereupon, the improvement comprising, in combination:

said photogenerative element having a first size and shape;

said blocking element having a second size and shape, the second size being different than the first size:

the first and second sizes and shapes cooperating to define an overall pixel configuration which (1) optimizes the geometrical packing density of pixels in an array and (2) allows the photogenerative element and the blocking element to be operatively disposed in close relationship to one another so as to sense substantially the same incident radiation, thereby eliminating cross-talk.

2. A pixel as in claim 1, wherein said photogenerative element and said blocking element are disposed in a generally coplanar relationship.

3. A pixel as in claim 1, wherein said blocking element is photogenerative.

4. A pixel as in claim 1, wherein said blocking element is also photogenrative, said blocking element contributes to said detectable signal by generating electron-hole pairs in response to incident radiation.

5. A pixel as in claim 1, wherein said photogenerative element and said blocking element are disposed in stacked relationship and said blocking element is also photogenerative, said blocking element contributes said detectable signal by generating electron-hole pairs in response to incident radiation.

6. A pixel as in claim 1, wherein said first and second shapes cooperate to define a rectangular pixel configuration.

7. A pixel as in claim 1, wherein said first and second shapes cooperate to define a polygonal pixel configuration.

8. A pixel as in claim 1, wherein one of said first shape and said second shape is generally rectangular.

9. A pixel as in claim 1, wherein both of said first and said second shapes are generally rectangular.

10. A pixel as in claim 1, wherein the ratio of the surface area of the photogenerative element to the blocking element is at least 5:1.

11. A pixel as in claim 1, wherein the ratio of the surface area of the photogenerative element to the blocking element is at least 10:1.

12. A pixel as in claim 1, wherein said photogenerative element is a photoresistor.

13. A pixel as in claim 1, wherein said photogenerative element is a phototransistor.

14. A pixel as in claim 1, wherein said photogenerative element is a photodiode.

15. A pixel as in claim 14, wherein said photodiode is a Schottky barrier diode.

16. A pixel as in claim 14, wherein said photodiode includes oppositely doped layers formed of thin film semiconductor alloy material.

17. A pixel as in claim 16, wherein said photodiode further includes a layer formed of substantially intrinsic semiconductor alloy material interposed between said oppositely doped layers so as to form a p-i-n type photodiode.

18. A pixel as in claim 17, wherein at least photodiode is formed from a material chosen from the group consisting essentially of: amorphous silicon alloy materials, amorphous germanium alloy materials, and amorphous silicon germanium alloy materials.

19. A pixel as in claim 17, wherein said photogenerative element includes a plurality of p-i-n type photodiodes stacked in optical and electrical series relationship.

20. A pixel as in claim 1, wherein said blocking element is a transistor.

21. A pixel as in claim 1, wherein said blocking element is a diode.

22. A pixel as in claim 21, wherein said diode is a Schottky barrier diode.

23. A pixel as in claim 21, wherein said diode includes a pair of oppositely doped layers of thin film semiconductor alloy material.

24. A pixel as in claim 23, wherein said diode includes a layer of substantially intrinsic semiconductor alor material interposed between said oppositely doped layers so as to provide a p-i-n type diode.

25. A pixel as in claim 24, wherein said p-i-n type diode includes at least one layer of semiconductor alloy material chosen from the group consisting essentially of: amorphous silicon alloy materials, amorphous germanium alloy materials, and amorphous silicon germanium alloy materials.

26. A pixel as in claim 24, wherein said diode comprises a plurality of stacked p-i-n type diodes disposed in optical and electrical series relationship.

* * * * *